US007292073B2

(12) United States Patent
Khan et al.

(10) Patent No.: US 7,292,073 B2
(45) Date of Patent: Nov. 6, 2007

(54) TRANSMISSION LINE DRIVER CIRCUIT (75) Inventors: Qadeer A. Khan, New Delhi (IN); Divya Tripathi, Bhopal (IN)

(73) Assignee: Freescale Semiconductor, Inc., Austin, TX (US)

( * ) Notice: Subject to any disclaimer, the term of this patent is extended or adjusted under 35 U.S.C. 154(b) by 24 days.

(21) Appl. No.: 11/443,198

(22) Filed: May 30, 2006

(65) Prior Publication Data

US 2006/0267641 A1 Nov. 30, 2006

(30) Foreign Application Priority Data

May 30, 2005 (IN) ........................ 1394/DEL/2005

(51) Int. Cl.
*H03K 3/00* (2006.01)
(52) U.S. Cl. ........................ 327/108; 327/112; 327/170
(58) Field of Classification Search ................ 327/108, 327/112, 170
See application file for complete search history.

(56) References Cited

U.S. PATENT DOCUMENTS

| 4,329,600 | A | * | 5/1982 | Stewart | ........................ 361/89 |
| 4,857,863 | A | * | 8/1989 | Ganger et al. | ............... 330/264 |
| 5,179,299 | A | * | 1/1993 | Tipon | ........................... 326/86 |
| 5,973,534 | A | | 10/1999 | Singh | |
| 5,999,034 | A | | 12/1999 | Singh et al. | |
| 6,057,710 | A | | 5/2000 | Singh | |
| 6,236,239 | B1 | * | 5/2001 | Kogushi | ...................... 326/88 |
| 6,271,699 | B1 | * | 8/2001 | Dowlatabadi | ............... 327/170 |
| 6,617,897 | B2 | | 9/2003 | Lee | |
| 7,187,197 | B2 | * | 3/2007 | Tripathi et al. | ............... 326/29 |

OTHER PUBLICATIONS

Lim, C.H., Output Buffer With Self-adjusting Slew Rate and On-Chip Compensation, Daasch, W.R. IEEE Symposium on IC/Package Design Integration, 1998. Proceedings. pp. 51-55, Feb. 2-3, 1998.

Choi, Seok-Woo and Park, Hong-June; A PVT-insensitive CMOS Output Driver with Constant Slew Rate, Proceedings of 2004 IEEE Asia Pacific Conference on Advanced System Integrated Circuits 2004., Aug. 4-5, 2004, pp. 116-119.

(Continued)

*Primary Examiner*—Kenneth B. Wells
(74) *Attorney, Agent, or Firm*—Charles Bergere (57) ABSTRACT

A transmission line driver circuit that operates at a first voltage level is fabricated using devices that operate at a second, lower voltage level. The driver circuit includes a ramp generator that receives a speed signal and a data signal and generates a charge ramp signal and a discharge ramp signal. A pair of series connected source follower transistors have their gates connected to respective charge and discharge signal outputs of the ramp generator. The driver circuit output signal is generated at an output node between the sources of the NMOS and PMOS source follower transistors. A charge_ls generator circuit provides a charge_ls signal and a discharge_ls generator circuit provides a discharge_ls signal. A pair of protection transistors includes a first NMOS protection transistor and a first PMOS protection transistor, which are connected in series with respective ones of the source follower transistors, and their gates are connected to respective ones of the charge and discharge signals. The pair of protection transistors prevents the voltage across the NMOS and PMOS source follower transistors from exceeding their breakdown voltages.

19 Claims, 3 Drawing Sheets

OTHER PUBLICATIONS

Tschanz, J.W et al., Adaptive body bias for reducing impacts of die-to-die and within-die parameter variations on microprocessor frequency and leakage. IEEE Journal of Solid-State Circuits, vol. 37, Issue 11 Nov. 2002. pp. 1396-1402.

Jung-Bae Lee et al.; Digitally-controlled DLL and I/O circuits for 500 Mb/s/pin×16 DDR SDRAM. Solid-State Circuits Conference, 2001, Digest of Technical Papers, ISSCC. 2001 IEEE International Feb. 5-7, 2001. pp. 68-69, 431.

Esch, G., Jr.; Chen, T.; Near-linear CMOS 1/0 driver with less sensitivity to process, voltage, and temperature variations. Very Large Scale Integration (VLSI) Systems, IEEE Transactions on vol. 12, Issue 11 Nov. 2004. pp. 1253-1257.

Chen, T.; Naffziger, S.; Comparison of adaptive body bias (ABB) and adaptive supply voltage (ASV) for improving delay and leakage under the presence of process variation, Very Large Scale Integration (VLSI) Systems, IEEE Transactions on vol. 11, Issue 5, Oct. 2003, pp. 888-899.

Soon-Seod Lee; Tae-Giem Lo,; Kae-Tack Yoo; Soo-Won Kim; Process-and-temperature compensated CMOS voltage-controlled oscillator for clock generators, Electronics Letters, vol. 39, Issue 21, Oct. 16, 2003, pp. 1484-1485.

Khan, Q.A.; Wadhwa, S.K.; Misri, K.; A tunable g/sub m/-C filter with low variation across process, voltage and temperature. VLSI Design, 2004. Proceedings 17$^{th}$ International Conference 2004, pp. 539-544.

Hua Chi; Stout, D.; Chickanosky, J.; Process, voltage and temperature compensation of off-chip-driver circuits for sub-0.25-?m CMOS technology, ASIC Conference and Exhibit, 1997, Proceedings, Tenth Annual IEEE International Sep. 7-10, 1997, pp. 279-282.

Dowlatabadi, Ahmad B., A Robust, Load-Insensitive Pad Driver, IEEE Journal of Solid State Circuits, vol. 35, No. 4, pp. 660-665, Apr. 1, 2000.

Hwang, Cherng Chow and Chen, Yi Huang, Novel Output Buffer Design for Universal Serial Bus Applications, The second IEEE Asia Pacific Conference on ASICS 2000, pp. 69-72, Aug. 28-30, 2000.

* cited by examiner

TRANSMISSION LINE DRIVER CIRCUIT

BACKGROUND OF THE INVENTION

The present invention relates generally to integrated circuits and, more particularly, to driver circuits for integrated circuit pads.

Integrated circuits process input signals and generate output signals. To communicate with the outside world, integrated circuits have I/O pads, which allow for connection to external devices. Thus, integrated circuits usually include both a data transmitter or driver circuit, and a receiver circuit. Communicating data signals can be complicated and is the subject of extensive studies relating to transmission lines. To reduce data signal ringing and signal interference, the rise time or slew rate of a signal transmitted on a bus is often controlled.

Continued reduction of integrated circuit sizes has led to a corresponding lowering of voltage supply levels and the use of low voltage devices. However, the peripheral circuits and I/O supply levels continue to operate at higher voltage supply levels. For example, a bus driver circuit may operate at 3.3V, but the fabrication process may not support such high voltage devices. Operating the lower voltage devices at higher voltage levels leads to reliability issues like hot carrier injection, gate oxide, and source drain breakdown.

Accordingly, it is an object of the present invention to provide a transmission line driver circuit formed with low voltage devices, yet operable with a higher supply voltage without degrading device reliability.

BRIEF DESCRIPTION OF THE DRAWINGS

The following detailed description of a preferred embodiment of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description in connection with the appended drawings is intended as a description of one embodiment of the invention, and is not intended to represent the only form in which the present invention may be practiced. It is to be understood that the same or equivalent functions may be accomplished by different embodiments that are intended to be encompassed within the spirit and scope of the invention.

The present invention provides a transmission line driver circuit that generates an output signal, including a ramp generator that receives a speed signal and a data signal and generates a charge ramp signal and a discharge ramp signal; a pair of source follower transistors, charge_ls and discharge_ls generator circuits for generating a charge_ls signal and a discharge_ls signal, respectively, and a pair of first protection transistors. The pair of source follower transistors includes a NMOS source follower transistor having a gate connected to the ramp generator and receiving the charge ramp signal, and a PMOS source follower transistor having a gate connected to the ramp generator and receiving the discharge ramp signal, and a source connected to a source of the NMOS source follower transistor. The output signal is generated at an output node between the sources of the NMOS and PMOS source follower transistors. The pair of first protection transistors includes a first NMOS protection transistor having a source connected to a drain of the NMOS source follower transistor, a drain connected to a first reference voltage (VUSB), and a gate connected to the charge_ls generator circuit and receiving the charge_ls signal, and a first PMOS protection transistor having a source connected to a drain of the PMOS source follower transistor, a drain connected to ground, and gate connected to the discharge_ls generator circuit and receiving the discharge_ls signal. The output signal varies from the ground voltage to the first reference voltage (VUSB) and the NMOS and PMOS source follower transistors and the pair of first protection transistors comprise devices that operate at a second reference voltage level lower than the first reference voltage level. The pair of first protection transistors prevents the voltage across the NMOS and PMOS source follower transistors from exceeding a breakdown voltage thereof.

The transmission line driver circuit of the present invention is useful for I/O drivers that have an output signal swing from, for example, 0 to 3.3v yet the circuit is fabricated with 2.5v devices, such as full and low speed USB transmitters.

The transmission line driver uses a source follower topology for fixing the rise and fall time independent of load capacitance. The rise and fall time of the output is set by the rise and fall time of constant slew rate ramp signals, which are generated by charging fixed capacitors with constant current sources. The charge and discharge ramp signals are applied to gates of source follower NMOS and PMOS transistors, respectively. The source nodes are charged only up to a voltage Vdd-Vtn and discharged to Vtp.

Figure 1:
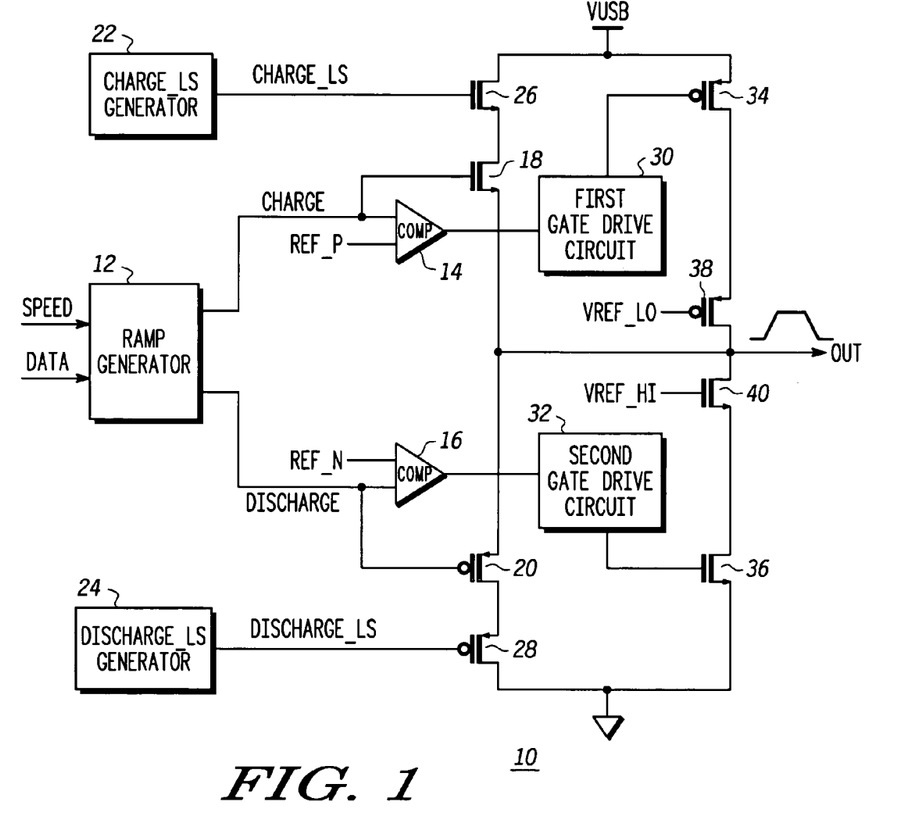
FIG. 1 is a schematic circuit diagram of a transmission line driver circuit in accordance with the present invention.

Referring now to FIG. 1, a schematic circuit diagram of a transmission line driver circuit 10 in accordance with the present invention is shown. The transmission line driver circuit 10 receives a data input signal (data) and provides an output signal (out) at an output node. The embodiment of the invention shown is for a Universal Serial Bus (USB) driver. The transmission line driver circuit 10 also has a speed input signal that controls a mode of operation of the driver circuit 10. That is, the driver circuit 10 has a full speed mode and a low speed mode. For the USB, the full speed mode is 12 Mbps and the low speed mode is 1.5 Mbps. In the embodiment shown, when the speed signal is high, the driver circuit 10 is in full speed mode and when the speed signal is low, the driver circuit 10 is in low speed mode.

The driver circuit 10 includes a ramp generator 12 that receives the speed signal and the data signal and generates a charge ramp signal and a discharge ramp signal. The charge and discharge ramp signals are substantially constant slew rate ramp signals generated by charging and discharging fixed capacitors with constant current sources, as will be discussed in more detail below.

First and second comparators 14 and 16 are coupled to the ramp generator 12. The first comparator 14 has a first input that receives the charge ramp signal, a second input that receives a p_reference voltage signal (ref_p), and generates a first comparator output signal at an output terminal thereof. Similarly, the second comparator 16 has a first input that receives the discharge ramp signal, a second input that receives a n_reference voltage signal (ref_n), and generates a second comparator output signal at an output thereof. The p_reference voltage signal is about 2.6v and the n_reference voltage signal is 0.7v.

A pair of source follower transistors is coupled to the ramp generator 12. More particularly, a NMOS source follower transistor 18 has a gate connected to the ramp generator 12 and receives the charge ramp signal, and a PMOS source follower transistor 20 has a gate connected to the ramp generator 12 and receives the discharge ramp signal. A source of the PMOS source follower transistor 20 is connected to a source of the NMOS source follower transistor 18. The driver circuit output signal is generated at an output node between the sources of the NMOS and PMOS source follower transistors 18 and 20. The NMOS source follower transistor 18 may have a bulk connected to its source and the PMOS source follower transistor 20 may have a bulk connected to its source. Alternatively, the bulks of the NMOS and PMOS source follower transistors 18 and 20 may be connected to gnd and VUSB, respectively.

The driver circuit 10 further includes a charge_ls generator circuit 22 for generating a charge_ls signal and a discharge_ls generator circuit 24 for generating a discharge_ls signal. A pair of first protection transistors is provided to prevent the voltage across the NMOS and PMOS source follower transistors 18 and 20 from exceeding a breakdown voltage thereof. The pair of first protection transistors includes a first NMOS protection transistor 26 having a source connected to a drain of the NMOS source follower transistor 18, a drain connected to a first reference voltage (VUSB), and a gate connected to the charge generator circuit 22 and receiving the charge_ls signal, and a first PMOS protection transistor 28 having a source connected to a drain of the PMOS source follower transistor 20, a drain connected to ground, and a gate connected to the discharge generator circuit 24 and receiving the discharge_ls signal. According to the present invention, the output signal varies from the ground voltage to the first reference voltage (VUSB), and the NMOS and PMOS source follower transistors 18, 20 and the pair of first protection resistors 26, 28 comprise devices that operate at a second reference voltage level lower than the first reference voltage level. For example, for a USB transmitter that has a first reference voltage of about 3.3v, the transistors may be 2.5v devices.

In one embodiment of the invention, the driver circuit 10 also includes a first gate driver circuit 30 that receives the first comparator 14 output signal and generates a first gate driver signal, and a second gate driver circuit 32 that receives the second comparator 16 output signal and generates a second gate driver signal.

The driver circuit 10 also includes a pair of secondary drive transistors including a PMOS secondary drive transistor 34 having a source connected to the first reference voltage (VUSB) and a gate connected to the first gate drive circuit 30 and receiving the first gate driver signal, and a NMOS secondary drive transistor 36 having a source connected to the ground and a gate connected to the second gate drive circuit 32 and receiving the second gate driver signal.

A pair of second protection transistors is provided to protect the pair of secondary drive transistors 34, 36 from exceeding their breakdown voltages. The pair of second protection transistors includes a second PMOS protection transistor 38 having a source connected to a drain of the PMOS secondary drive transistor 34 and a drain connected to the output node, and a second NMOS protection transistor 40 having a source connected to a drain of the NMOS secondary drive transistor 36 and a drain connected to the output node. The gate of the second PMOS protection transistor 38 is connected to a low reference voltage (Vref_lo) while the gate of the second NMOS protection transistor 40 is connected to a high reference voltage (Vref_hi). For a USB driver circuit, the high reference voltage signal is about 2.6v and the low reference voltage signal is about 700 mV.

Figure 2:
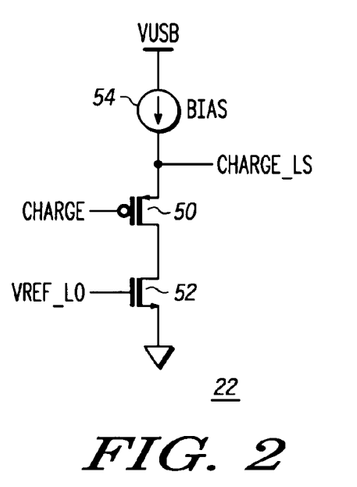
FIG. 2 is a schematic circuit diagram of a charge_ls signal generator of FIG. 1.

Referring now to FIG. 2, a schematic circuit diagram of the charge_ls generator circuit 22 is shown. The charge_ls generator circuit 22 includes a first charge PMOS transistor 50 having a gate that receives the charge ramp signal from the ramp generator 12, and a second charge PMOS transistor 52 having a source connected to a drain of the first charge PMOS transistor 50, a drain connected to the ground, and a gate connected to a low reference voltage source and receiving the low reference voltage (Vref_lo). A first bias current source 54 is connected between the first reference voltage (VUSB) and the source of the first charge PMOS transistor 50. The charge_ls signal is generated at a node between the first bias current source 54 and the source of the first charge PMOS transistor 50. The second charge PMOS transistor 52 acts as a protection circuit to protect the first charge PMOS transistor 50 from exceeding its breakdown voltage.

Figure 3:
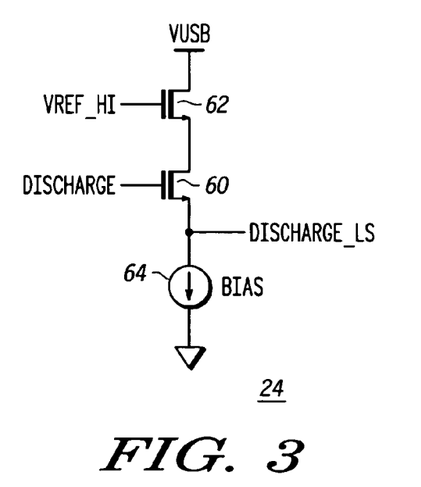
FIG. 3 is a schematic circuit diagram of a discharge_ls signal generator of FIG. 1.

Referring now to FIG. 3, a schematic circuit diagram of the discharge generator circuit 24 is shown. The discharge_ls generator circuit 24 includes a first discharge NMOS transistor 60 having a gate that receives the discharge ramp signal from the ramp generator 12, and a second discharge NMOS transistor 62 having a source connected to a drain of the first discharge NMOS transistor 60, a drain connected to the first reference voltage (VUSB), and a gate connected to a high reference voltage source and receiving the high reference voltage (Vref_hi). A second bias current source 64 is connected between a source of the first discharge NMOS transistor 60 and the ground. The discharge_ls signal is generated at a node between the second bias current source 64 and the source of the first discharge NMOS transistor 60. The second discharge NMOS transistor 62 acts as a protection circuit to protect the first discharge NMOS transistor 60 from exceeding its breakdown voltage.

Figure 4:
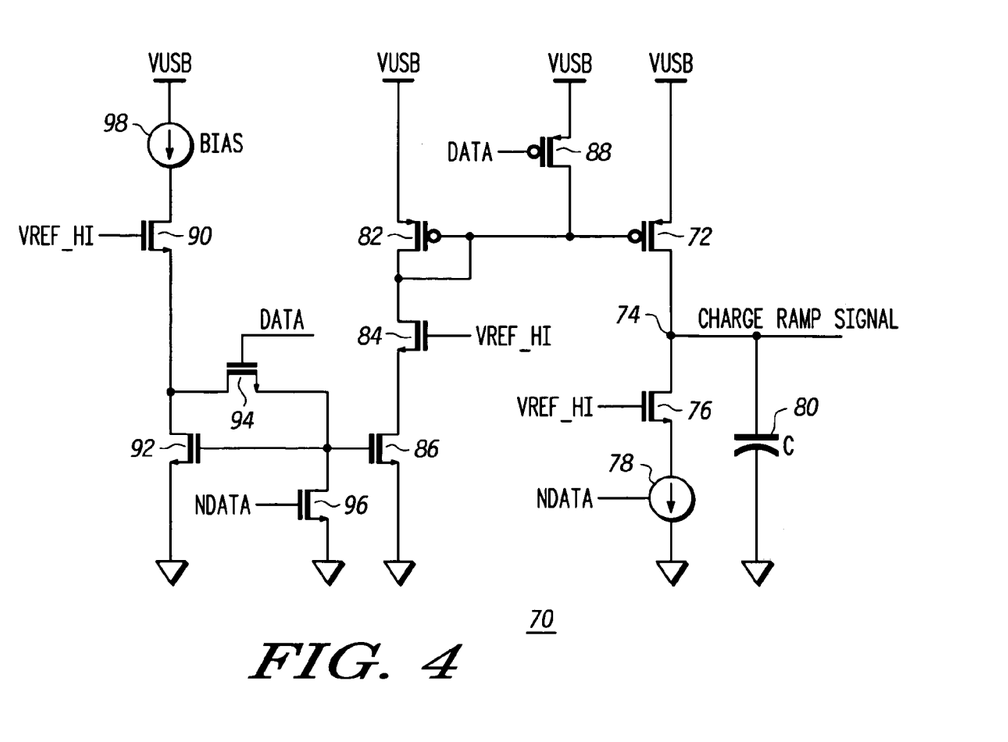
FIG. 4 is a schematic circuit diagram of a high side ramp generator in accordance with the present invention.

In one embodiment of the invention, the ramp generator 12 includes a high side ramp generator that generates the charge signal and a low side ramp generator that generates the discharge signal. Referring now to FIG. 4, a schematic circuit diagram of a high side ramp generator 70 in accordance with the present invention is shown. The high side ramp generator 70 includes a first PMOS transistor 72 having a source connected to the first reference voltage (VUSB) and a drain connected to a charge node 74. A first NMOS transistor 76 has a drain connected to the drain of the first PMOS transistor 72 at the charge node 74, and a gate that receives the high reference voltage (Vref_hi). A first current source 78 is connected between the source of the first NMOS transistor and the ground. The speed signal is used to change the ramp rate and the data signal (which is a level shifted data signal) turns the current path on and off. The first NMOS transistor 76 acts as a protection device that protects a transistor of the first current source 78 from exceeding its breakdown voltage. A first capacitor 80 has a first terminal connected to the charge node 74 and a second terminal connected to the ground. The charge ramp signal is generated at the charge node 74.

A second PMOS transistor 82 has a source connected to the first reference voltage (VUSB), a gate connected to a gate of the first PMOS transistor 72, and a drain connected to its gate. A second NMOS transistor 84 has a drain connected to the drain of the second PMOS transistor 82 and a gate connected to the high reference voltage (Vref_hi). A third NMOS transistor 86 has a drain connected to a source of the second NMOS transistor 84 and a source connected to the ground. A third PMOS transistor 88 has a source connected to the first reference voltage (VUSB), a gate that receives the level shifted data signal, and a drain connected to the gates of the first and second PMOS transistors 72 and 82. A fourth NMOS transistor 90 has a gate receiving the high reference voltage (Vref_hi), and a fifth NMOS transistor 92 has a drain connected to a source of the fourth NMOS transistor 90, a source connected to the ground, and a gate connected to a gate of the third NMOS transistor 86. A sixth NMOS transistor 94 has a drain connected to a node between the source of the fourth NMOS transistor 90 and the drain of the fifth NMOS transistor 92, and a gate that receives the level shifted data signal. A seventh NMOS transistor 96 has a drain connected to a source of the sixth NMOS transistor 94, a source connected to the ground, and a gate that receives an inverted level shifted data signal (NDATA). A second current source 98 is connected between the first reference voltage (VUSB) and the drain of the high reference voltage (Vref_hi).

Figure 5:
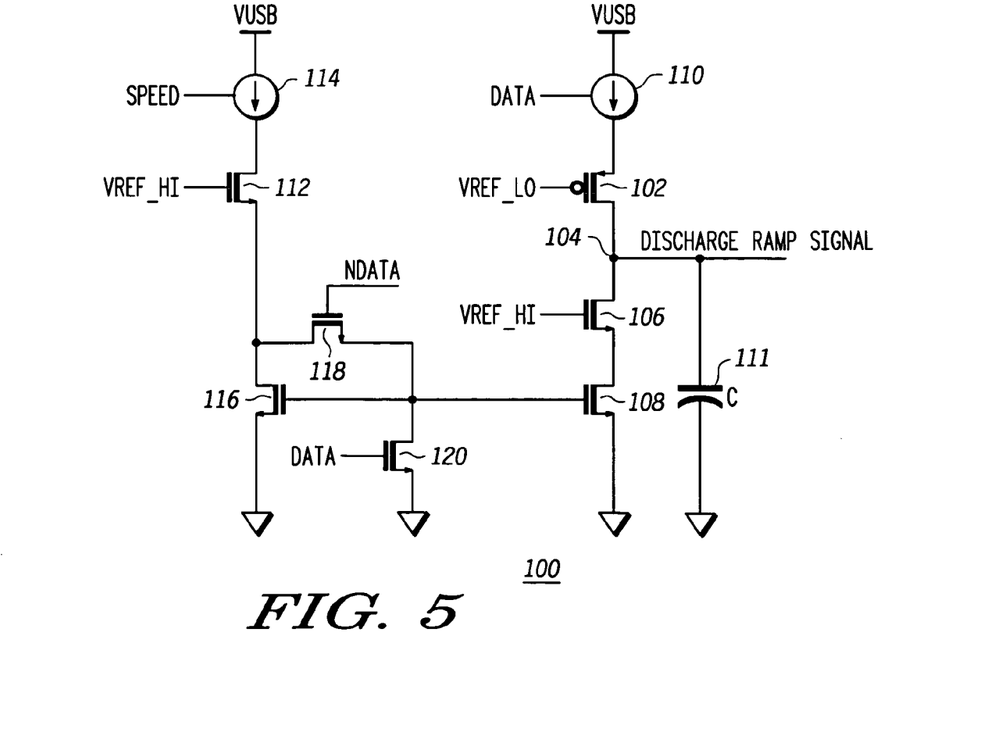
FIG. 5 is a schematic circuit diagram of a low side ramp generator in accordance with the present invention.

A schematic block diagram of a low side ramp generator 100 in accordance with the present invention is shown in FIG. 5. The low side ramp generator 100 includes a fourth PMOS transistor 102 having a gate that receives the low reference voltage (Vref_lo), and a drain connected to a discharge node 104. An eighth NMOS transistor 106 has a drain connected to the drain of the fourth PMOS transistor 102 at the discharge node 104, and a gate that receives the high reference voltage (Vref_hi). A ninth NMOS transistor 108 has a drain connected to a source of the eighth NMOS transistor 106, and a source connected to the ground. A third current source 110 is connected between the first reference voltage signal (VUSB) and the source of the third PMOS transistor 102. As previously discussed, the speed signal is used to change the ramp rate and the data signal turns the current path on and off. A second capacitor 111 has a first terminal connected to the discharge node 104, and a second terminal connected to the ground. The discharge ramp signal is generated at the discharge node 104.

A tenth NMOS transistor 112 has a gate connected to the high reference voltage (Vref_hi). A fourth current source 114 is connected between the first reference voltage (VUSB) and the drain of the tenth NMOS transistor 112. An eleventh NMOS transistor 116 has a drain connected to the source of the tenth NMOS transistor 112, a source connected to the ground, and a gate connected to a gate of the ninth NMOS transistor 108. A twelfth NMOS transistor 118 has a drain connected to the source of the tenth NMOS transistor 112 and the drain of the eleventh NMOS transistor 116, and a gate that receives the inverted level shifted data signal. A thirteenth NMOS transistor 120 has a drain connected to a source of the twelfth NMOS transistor 118, a source connected to the ground, and a gate that receives the level shifted data signal.

Figure 6A:
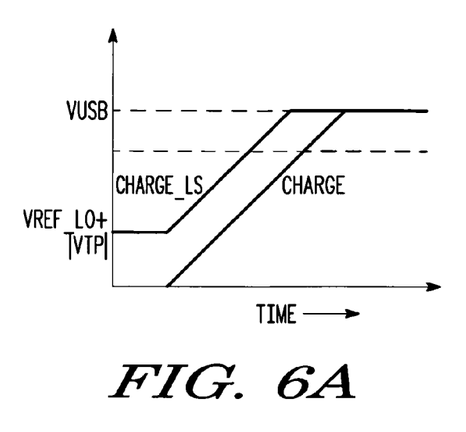
FIGS. 6A and 6B are graphs illustrating waveforms of the charge_ls and discharge_ls generator circuits of FIGS. 2 and 3 with respect to the charge and discharge ramp signals generated by the ramp generators of FIGS. 4 and 5, respectively.
Figure 6B:
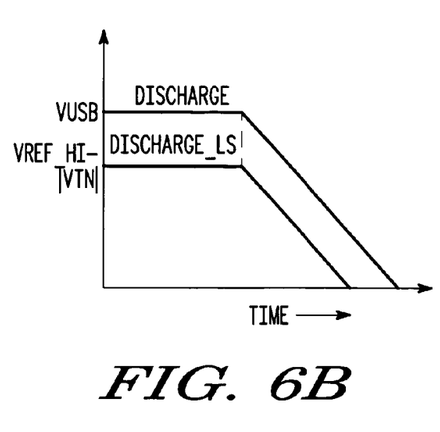

Referring now to FIGS. 6A and 6B, graphs illustrating the waveforms of the charge_ls and discharge_ls signals generated by the charge_ls and discharge_ls generators 22 and 24, respectively, with respect to the charge and discharge ramp signals generated by the ramp generator 12. FIG. 6A shows that the charge_ls signal goes from an initial value of Vref_lo+|Vtp| to VUSB while the charge ramp signal goes from 0 to VUSB. In contrast, FIG. 6B shows that the discharge_ls signal goes from an initial value of Vref_hi−|Vtn| to 0, while the discharge ramp signal goes from VUSB to 0.

Figure 7A:
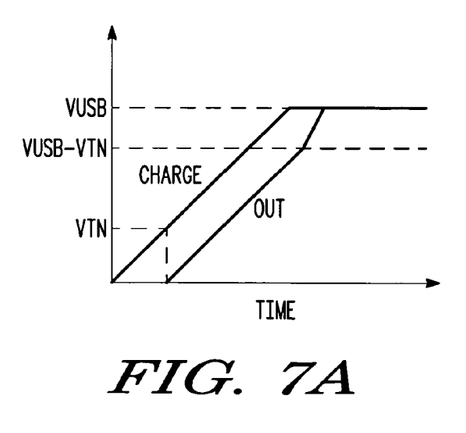
FIGS. 7A and 7B are graphs illustrating rise and fall transitions of output waveforms of the transmission line driver circuit of FIG. 1.
Figure 7B:
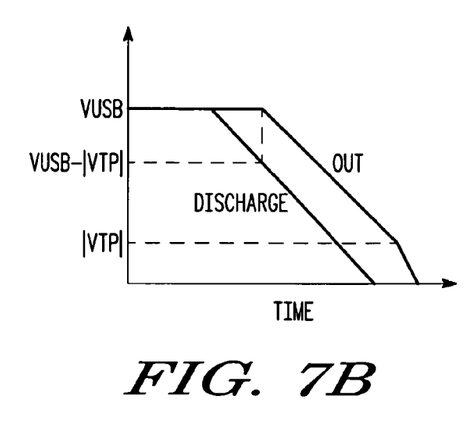

Referring now to FIGS. 7A and 7B, graphs illustrating the output waveforms with rise and fall transitions are shown. FIG. 7A shows the driver circuit 10 output and the charge signal of the high side ramp generator 70. As illustrated, the driver circuit 10 output follows the charge signal with a difference of Vtn (NMOS transistor threshold voltage). After the charge signal reaches the first reference voltage (Vref_p), the PMOS secondary drive transistor 34 is turned ON to charge the output node to the first output level (VUSB). The first reference voltage Vref_p should be less than or equal to the first voltage level (VUSB)−Vtn.

FIG. 7B shows that driver circuit 10 output follows the discharge signal generated by the low side ramp generator 100 with a difference of Vtp (PMOS transistor threshold voltage). After the discharge signal reaches the second reference voltage (Vref_n), the NMOS secondary transistor 36 is turned ON to discharge the output node to the ground voltage level. The second reference voltage Vref_n should be greater than or equal to |Vtp|.

While various embodiments of the invention have been illustrated and described, it will be clear that the invention is not limited to these embodiments only. Numerous modifications, changes, variations, substitutions, and equivalents will be apparent to those skilled in the art, without departing from the spirit and scope of the invention, as described in the claims.

The invention claimed is:

1. A transmission line driver circuit that generates an output signal, comprising:
   a ramp generator that receives a speed signal and a level shifted data signal and generates a charge ramp signal and a discharge ramp signal;
   a pair of source follower transistors, including an NMOS source follower transistor having a gate connected to the ramp generator and receiving the charge ramp signal, and a PMOS source follower transistor having a gate connected to the ramp generator and receiving the discharge ramp signal, and a source connected to a source of the NMOS source follower transistor, wherein the output signal is generated at an output node between the sources of the NMOS and PMOS source follower transistors;
   a charge_ls generator circuit for generating a charge_ls signal;
   a discharge_ls generator circuit for generating a discharge_ls signal; and
   a pair of first protection transistors including a first NMOS protection transistor having a source connected to a drain of the NMOS source follower transistor, a drain connected to a first reference voltage (VUSB), and a gate connected to the charge_ls generator circuit and receiving the charge_ls signal, and a first PMOS protection transistor having a source connected to a drain of the PMOS source follower transistor, a drain connected to ground, and gate connected to the discharge_ls generator circuit and receiving the discharge_ls signal, wherein the output signal varies from the ground voltage to the first reference voltage (VUSB) and the NMOS and PMOS source follower transistors and the pair of first protection resistors comprise devices that operate at a second reference voltage level lower than the first reference voltage level.

2. The transmission line driver circuit of claim 1, wherein the pair of first protection transistors prevent the voltage across the NMOS and PMOS source follower transistors from exceeding a breakdown voltage thereof.

3. The transmission line driver circuit of claim 1, further comprising:
   a pair of secondary drive transistors including a PMOS secondary drive transistor having a source connected to the first reference voltage, and a NMOS secondary drive transistor having a source connected to the ground; and
   a pair of second protection transistors including a second PMOS protection transistor having a source connected to a drain of the PMOS secondary drive transistor and a drain connected to the output node, and a second NMOS protection transistor having a source connected to a drain of the NMOS secondary drive transistor and a drain connected to the output node, wherein the pair of second protection transistors prevent the voltages across the pair of secondary drive transistors from exceeding a breakdown voltage thereof.

4. The transmission line driver circuit of claim 3, further comprising:
   a first comparator having a first input connected to the ramp generator and receiving the charge ramp signal, a second input that receives a p_reference voltage signal, and a first comparator output signal;
   a second comparator having a first input connected to the ramp generator and receiving the discharge ramp signal, a second input that receives a n_reference voltage signal, and a second comparator output signal;
   a first gate driver circuit that receives the first comparator output signal and generates a first gate driver signal;
   a second gate driver circuit that receives the second comparator output signal and generates a second gate driver signal, wherein the first gate driver circuit is connected to a gate of the PMOS secondary drive transistor and the second gate driver circuit is connected to a gate of the NMOS secondary drive transistor.

5. The transmission line driver circuit of claim 4, wherein the p_reference voltage signal is about 2.6v and the n_reference voltage signal is about 600 mV.

6. The transmission line driver circuit of claim 3, wherein the charge_ls generator circuit comprises:
   a first charge PMOS transistor having a gate that receives the charge ramp signal from the high side ramp generator;
   a second charge PMOS transistor having a source connected to a drain of the first charge PMOS transistor, a drain connected to the ground, and a gate connected to a low reference voltage source and receiving a low reference voltage (Vref_lo); and
   a first bias current source connected between the first reference voltage (VUSB) and the source of the first charge PMOS transistor, wherein the charge_ls signal is generated at a node between the first bias current source and the source of the first charge PMOS transistor.

7. The transmission line driver circuit of claim 6, wherein the discharge_ls generator circuit comprises:
   a first discharge NMOS transistor having a gate that receives the discharge ramp signal from the low side ramp generator;
   a second discharge NMOS transistor having a source connected to a drain of the first discharge NMOS transistor, a drain connected to the first reference voltage (VUSB), and a gate connected to a high reference voltage source and receiving a high reference voltage (Vref_hi); and
   a second bias current source connected between a source of the first discharge NMOS transistor and the ground, wherein the discharge_ls signal is generated at a node between the second bias current source and the source of the first discharge NMOS transistor.

8. The transmission line driver circuit of claim 7, wherein the ramp generator comprises a high side ramp generator and a low side ramp generator.

9. The transmission line driver circuit of claim 8, wherein the high side ramp generator comprises:
   a first PMOS transistor having a source connected to the first reference voltage (VUSB), and a drain connected to a charge node;
   a first NMOS transistor having a drain connected to the drain of the first PMOS transistor at the charge node, and a gate that receives the high reference voltage (Vref_hi);
   a first current source connected between the source of the first NMOS transistor and the ground;
   a first capacitor having a first terminal connected to the charge node, and a second terminal connected to the ground, wherein the charge ramp signal is generated at the charge node;
   a second PMOS transistor having a source connected to the first reference voltage (VUSB), a gate connected to a gate of the first PMOS transistor, and a drain connected to its gate;
   a second NMOS transistor having a drain connected to the drain of the second PMOS transistor, and a gate connected to the high reference voltage (Vref_hi);
   a third NMOS transistor having a drain connected to a source of the second NMOS transistor, and a source connected to the ground;
   a third PMOS transistor having a source connected to the first reference voltage (VUSB), a gate that receives the level shifted data signal; and a drain connected to the gates of the first and second PMOS transistors;
   a fourth NMOS transistor having a gate receiving the high reference voltage (Vref_hi);
   a fifth NMOS transistor having a drain connected to a source of the fourth NMOS transistor, a source connected to the ground, and a gate connected to a gate of the third NMOS transistor;
   a sixth NMOS transistor having a source connected to a node between the gate of the fifth NMOS transistor and the drain of the seventh NMOS transistor, and a gate that receives the level shifted data signal;
   a seventh NMOS transistor having a drain connected to a source of the sixth NMOS transistor, a source connected to the ground, and a gate that receives an inverted data signal; and
   a second current source connected between the first reference voltage (VUSB) and the drain of the fourth NMOS transistor.

10. The transmission line driver circuit of claim 9, wherein the low side ramp generator comprises:

a fourth PMOS transistor having a gate that receives the low reference voltage (Vref_lo), and a drain connected to a discharge node;

an eighth NMOS transistor having a drain connected to the drain of the fourth PMOS transistor at the discharge node, and a gate that receives the high reference voltage (Vref_hi);

a ninth NMOS transistor having a drain connected to a source of the eighth NMOS transistor, and a source connected to the ground;

a third current source connected between the first reference voltage signal (VUSB) and the source of the third PMOS transistor;

a second capacitor having a first terminal connected to the discharge node, and a second terminal connected to the ground, wherein the discharge ramp signal is generated at the discharge node;

a tenth NMOS transistor having a gate connected to the high reference voltage (Vref_hi);

a fourth current source connected between the first reference voltage (VUSB) and the drain of the tenth NMOS transistor;

an eleventh NMOS transistor having a drain connected to the source of the tenth NMOS transistor, a source connected to the ground, and a gate connected to a gate of the ninth NMOS transistor;

a twelfth NMOS transistor having a drain connected to the source of the tenth NMOS transistor and the drain of the eleventh NMOS transistor, and a gate that receives the inverted data signal; and a thirteenth NMOS transistor having a drain connected to a source of the twelfth NMOS transistor, a source connected to the ground, and a gate that receives the data signal.

11. The transmission line driver circuit of claim 10, wherein the speed signal changes a mode of operation of the transmission line driver circuit between a full speed mode and a low speed mode.

12. The transmission line driver circuit of claim 11, wherein the full speed mode is about 12 Mbps and the low speed mode is about 1.5 Mbps.

13. The transmission line driver circuit of claim 10, wherein the first reference voltage (VUSB) is about 3.3v, the high reference voltage is about 2.6v, and the low reference voltage is about 700 mV.

14. A transmission line driver circuit that generates an output signal, comprising:

a ramp generator that receives a speed signal and a data signal and generates a charge ramp signal and a discharge ramp signal;

a pair of source follower transistors, including an NMOS source follower transistor having a gate connected to the ramp generator and receiving the charge ramp signal, and a PMOS source follower transistor having a gate connected to the ramp generator and receiving the discharge ramp signal, and a source connected to a source of the NMOS source follower transistor, wherein the output signal is generated at an output node between the sources of the NMOS and PMOS source follower transistors;

a charge_ls generator circuit for generating a charge_ls signal;

a discharge_ls generator circuit for generating a discharge_ls signal;

a pair of first protection transistors including a first NMOS protection transistor having a source connected to a drain of the NMOS source follower transistor, a drain connected to a first reference voltage (VUSB), and a gate connected to the charge_ls generator circuit and receiving the charge_ls signal, and a first PMOS protection transistor having a source connected to a drain of the PMOS source follower transistor, a drain connected to ground, and gate connected to the discharge_ls generator circuit and receiving the discharge_ls signal, wherein the pair of first protection transistors prevent the voltage across the NMOS and PMOS source follower transistors from exceeding a breakdown voltage thereof, and wherein the output signal varies from the ground voltage to the first reference voltage (VUSB) and the NMOS and PMOS source follower transistors and the pair of first protection resistors comprise devices that operate at a second reference voltage level lower than the first reference voltage level;

a pair of secondary drive transistors including a PMOS secondary drive transistor having a source connected to the first reference voltage, and a NMOS secondary drive transistor having a source connected to the ground; and a pair of second protection transistors including a second PMOS protection transistor having a source connected to a drain of the PMOS secondary drive transistor and a drain connected to the output node, and a second NMOS protection transistor having a source connected to a drain of the NMOS secondary drive transistor and a drain connected to the output node, wherein the pair of second protection transistors prevent the voltages across the pair of secondary drive transistors from exceeding a breakdown voltage thereof.

15. The transmission line driver circuit of claim 14, further comprising:

a first comparator having a first input connected to the ramp generator and receiving the charge ramp signal, a second input that receives a p_reference voltage signal, and a first comparator output signal;

a second comparator having a first input connected to the ramp generator and receiving the discharge ramp signal, a second input that receives a n_reference voltage signal, and a second comparator output signal;

a first gate driver circuit that receives the first comparator output signal and generates a first gate driver signal;

a second gate driver circuit that receives the second comparator output signal and generates a second gate driver signal, wherein the first gate driver circuit is connected to a gate of the PMOS secondary drive transistor and the second gate driver circuit is connected to a gate of the NMOS secondary drive transistor.

16. The transmission line driver circuit of claim 15, wherein the p_reference voltage signal is about 2.6v and the n_reference voltage signal is about 0.7v.

17. The transmission line driver circuit of claim 15, wherein the charge_ls generator circuit comprises:

a first charge PMOS transistor having a gate that receives the charge ramp signal from the high side ramp generator;

a second charge PMOS transistor having a source connected to a drain of the first charge PMOS transistor, a drain connected to the ground, and a gate connected to a low reference voltage source and receiving a low reference voltage (Vref_lo); and a first bias current source connected between the first reference voltage (VUSB) and the source of the first charge PMOS transistor, wherein the charge_ls signal is generated at a node between the first bias current source and the source of the first charge PMOS transistor.

18. The transmission line driver circuit of claim 17, wherein the discharge_ls generator circuit comprises:
- a first discharge NMOS transistor having a gate that receives the discharge ramp signal from the low side ramp generator;
- a second discharge NMOS transistor having a source connected to a drain of the first discharge NMOS transistor, a drain connected to the first reference voltage (VUSB), and a gate connected to a high reference voltage source and receiving a high reference voltage (Vref_hi); and
- a second bias current source connected between a source of the first discharge NMOS transistor and the ground, wherein the discharge_ls signal is generated at a node between the second bias current source and the source of the first discharge NMOS transistor.

19. The transmission line driver circuit of claim 18, wherein the first reference voltage (VUSB) is about 3.3v, the high reference voltage is about 2.6v, and the low reference voltage is about 0.7v.

* * * * *